(12) United States Patent
Chong et al.

(10) Patent No.: US 7,579,680 B2
(45) Date of Patent: Aug. 25, 2009

(54) PACKAGING SYSTEM FOR SEMICONDUCTOR DEVICES

(75) Inventors: David Chong, Penang (MY); Hun Kwang Lee, Penang (MY)

(73) Assignee: Fairchild Semiconductor Corporation DE (US)

( * ) Notice: Subject to any disclaimer, the term of this patent is extended or adjusted under 35 U.S.C. 154(b) by 173 days.

(21) Appl. No.: 11/844,914

(22) Filed: Aug. 24, 2007

(65) Prior Publication Data

US 2008/0036054 A1 Feb. 14, 2008

Related U.S. Application Data

(62) Division of application No. 10/397,436, filed on Mar. 25, 2003, now Pat. No. 7,323,361.

(60) Provisional application No. 60/368,587, filed on Mar. 29, 2002.

(51) Int. Cl.
H01L 23/06 (2006.01)

(52) U.S. Cl. .............. 257/684; 257/692; 257/693; 257/694; 257/695; 257/696; 257/779; 257/787; 257/E23.031; 257/E23.039; 257/E23.066

(58) Field of Classification Search .......... 257/684, 257/692–696, 778–780, 787, E23.031, E23.033, 257/E23.039, E23.042, E23.043, E23.044, 257/E23.047, E23.048, E23.066
See application file for complete search history.

(56) References Cited

U.S. PATENT DOCUMENTS

| | | | |
|---|---|---|---|
| 4,653,993 A | 3/1987 | Boschman | |
| 5,202,849 A | 4/1993 | Nozaki | |
| 5,557,842 A | 9/1996 | Bailey | |
| 5,726,501 A | 3/1998 | Matsubara | |
| 5,844,315 A | 12/1998 | Melton et al. | |
| 5,894,108 A | 4/1999 | Mostafazadeh et al. | |
| 5,925,934 A | 7/1999 | Lim | |
| 6,077,724 A | 6/2000 | Chen | |
| 6,198,163 B1 | 3/2001 | Crowley et al. | |
| 6,249,041 B1 | 6/2001 | Kasem et al. | |
| 6,265,761 B1 | 7/2001 | Ghai | |
| 6,307,755 B1 | 10/2001 | Williams et al. | |
| 6,337,510 B1 * | 1/2002 | Chun-Jen et al. ............ 257/666 |

(Continued)

FOREIGN PATENT DOCUMENTS

JP P2000-307017 A 2/2000

(Continued)

*Primary Examiner*—Sue Purvis
*Assistant Examiner*—Leslie Pilar Cruz
(74) *Attorney, Agent, or Firm*—Kenneth E. Horton; Kirton & McConkie

(57) ABSTRACT

A package system for integrated circuit (IC) chips and a method for making such a package system. The method uses a solder-ball flip-chip method for connecting the IC chips onto a lead frame that has pre-formed gull-wing leads only on the source/gate side of the chip. A boschman molding technique is used for the encapsulation process, leaving exposed land and die bottoms for a direct connection to a circuit board. The resulting packaged IC chip has the source of the chip directly connected to the lead frame by solder balls. As well, the drain and gate of the chip are directly mounted to the circuit board without the need for leads from the drain side of the chip.

14 Claims, 4 Drawing Sheets

U.S. PATENT DOCUMENTS

| | | |
|---|---|---|
| 6,448,110 B1 | 9/2002 | Chen et al. |
| 6,528,880 B1 | 3/2003 | Planey |
| 6,717,260 B2 | 4/2004 | Pavier et al. |
| 6,744,124 B1 * | 6/2004 | Chang et al. ................ 257/678 |
| 7,084,488 B2 | 8/2006 | Thornton et al. |
| 2003/0025183 A1 | 2/2003 | Thornton et al. |
| 2003/0214019 A1 | 11/2003 | Chong et al. |

FOREIGN PATENT DOCUMENTS

| | | |
|---|---|---|
| JP | P2000-243887 A | 9/2000 |
| JP | P2001-7131 A | 1/2001 |
| JP | P32158686 | 3/2001 |
| JP | P2003-86737 A | 3/2003 |
| WO | 03/083908 | 10/2003 |

* cited by examiner

PACKAGING SYSTEM FOR SEMICONDUCTOR DEVICES

REFERENCE TO RELATED APPLICATIONS

This application is a divisional application of U.S. patent application Ser. No. 10/397,436, filed on Mar. 25, 2003 now U.S. Pat. No. 7,323,361, which claims priority from U.S. provisional patent application No. 60/368,587 filed on Feb. 29, 2002 the entire disclosure of which is incorporated herein by reference.

FIELD OF THE INVENTION

The invention generally relates to methods for fabricating integrated circuits (ICs) and semiconductor devices and the resulting structures. More particularly, the invention relates generally to the packaging used for IC and semiconductor devices. More specifically, the invention relates to a packaged integrated circuit having a low drain/source resistance, smaller footprint, low profile, excellent packaging inductance, excellent thermal performance, and a simplified manufacturing process.

BACKGROUND OF THE INVENTION

Semiconductor processing builds hundreds of individual IC (also called semiconductor) chips on a wafer. These individual chips are then tested, assembled, and packaged for their various uses. The packaging step can be an important step in terms of costs and reliability. The individual IC chip must be connected properly to leads (leading to external circuitry) and packaged in a way that is convenient for use in a larger circuit or electrical system.

Prior to packaging, the wafers containing the numerous IC chips are thinned from the side of the wafer away from the chips. The wafers are then mounted to an adhesive tape and cut into individual chips, typically using a dicing saw. The chips are then mounted onto a metal lead frame or on a metallized region of an insulating substrate. In this process, a thin layer of a metal (such as Au, optionally combined with Ge or other elements to improve the metal contact) is placed between the bottom of the chip and the metal lead frame/insulated substrate. Heat (and optionally a slight pressure) can then be applied to form an alloyed bond holding the chip firmly to the substrate.

Once the chips are mounted by this process, the chips are then wire bonded to the lead frame. This wire bonding is typically performed by attaching interconnecting wires from various contact pads on the IC chip to corresponding posts on the lead frame. The time used to bond wires individually to each pad on the chip can be overcome by several methods that utilize simultaneous bonding, i.e., the flip-chip approach. In this approach, relatively thick metal bumps are deposited on the contact pad before the chips are separated from the wafer. A matching metallization pattern is also provided on the substrate. After separation from the wafer, each chip is turned upside down and the bumps are properly aligned with the metallization pattern on the substrate. Then, ultrasonic bonding or solder alloying aids the attachment of each bump to its corresponding metallization pattern on the substrate.

The resulting device is then packaged in any suitable medium that can protect it from the environment of its intended use. In most cases, this means that the device is isolated from moisture, contaminants, and corrosion. The packaging used for such protection can be either hermetic-ceramic or plastic. In a plastic package, the chip is encapsulated with resin materials, typically epoxy-based resins.

FIGS. 4 and 5 depict an IC chip with a typical plastic package having a source 201, gate 202, and drain 203. The chip/die 206 is attached to the central support 207 of the lead frame. The frame, made of etched or stamped thin metal (e.g., Fe—Ni or Cu alloys), includes external leads 205 and the interconnections provided by the bond wires 204 are typically fine gold wires. The encapsulation 208 is often accomplished by a molding process that uses an epoxy resin to cover the chip and form the outer shape of the package at the same time. The external portions of the lead frame can be shaped as a gull wing lead or a j-lead (as depicted in FIG. 5).

Such prior art devices however, suffer from several problems. Namely, such devices have a relatively high drain-source resistance ($R_{DS(on)}$), a large footprint, a high profile, a poor package inductance, an inefficient thermal performance, and often require complex manufacturing processes.

SUMMARY OF THE INVENTION

The invention provides a package system for integrated circuit (IC) chips and a method for making such a package system. The method uses a solder-ball flip-chip method for connecting the IC chips onto a lead frame that has pre-formed gull-wing leads only on the source/gate side of the chip. A boschman molding technique is used for the encapsulation process, leaving exposed land and die bottoms for a direct connection to a circuit board. The resulting packaged IC chip has the source and gate of the chip directly connected to the lead frame by solder balls. As well, the drain of the chip is directly mounted to the circuit board without the need for leads from the drain side of the chip.

BRIEF DESCRIPTION OF THE DRAWINGS

The following description of the invention can be understood in light of FIGS. 1, 2A-2C, 3A-3B, and 4-5, in which:

FIGS. 1, 2A-2C, and 3A-3B illustrate specific aspects of the invention and are a part of the specification. Together with the following description, the Figures. demonstrate and explain the principles of the invention.

DETAILED DESCRIPTION OF THE INVENTION

The following description provides specific details in order to provide a thorough understanding of the invention. The skilled artisan, however, would understand that the invention can be practiced without employing these specific details. Indeed, the invention can be practiced by modifying the illustrated method and resulting product and can be used in conjunction with apparatus and techniques conventionally used in the industry. Indeed, as described briefly below, the invention can be adapted for packaging systems for electronics devices other than just ICs.

The packaged IC chip of the invention has several features. First, it has the source of the IC chip directly connected to the lead frame by solder balls. Second, the bottoms of the leads and the IC chip are not completely encapsulated. Third, the drain of the IC is directly mounted to the circuit board without the need for leads from the drain side of the IC.

Figure 1:
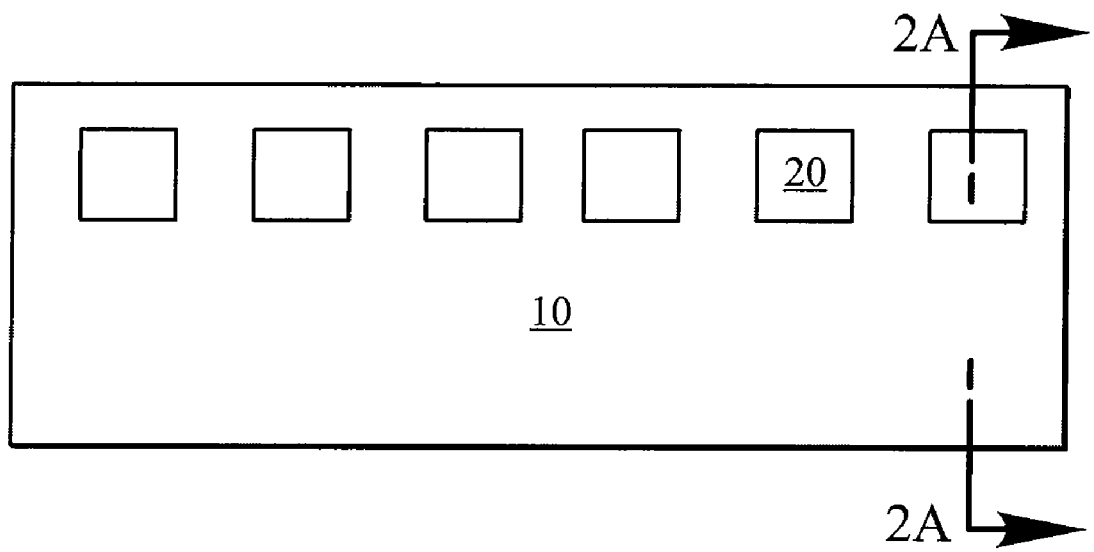
FIG. 1 illustrates a IC chip used in one aspect of the invention.

Any method that forms such a packaged IC chip can be used in the invention. In one aspect of the invention, the method described below is used to form such a packaged IC chip. To begin, the various IC chips are first manufactured on a wafer, cut from the wafer, and then tested. The individual chips are then bonded to a die as conventionally known in the art (and the combined chip and die will be referred hereafter to as die 10). During the manufacturing process, and as shown in FIG. 1, the IC chip is manufactured with a lined array of I/O points 11 for the internal circuitry of the chip to communicate with the external circuitry of the electronic device in which the packaged chip is used. This array can be made using any known process in the art when manufacturing the IC chip.

The chip is also manufactured to contain a plurality of metallization pads 20, typically made of aluminum (Al). The pads 20 are formed respectively over the I/O points 11 by any known process in the art. These metallization pads 20 can serve as test pads, bump pads, or both.

Next, the die 10 are connected to the lead frame by any flip-chip technique known in the art, including the process illustrated in 2B and 2C. As detailed in FIG. 2B, a bumping process is first performed to form a solder bump 40 on each metallization pad 20 over the semiconductor die 10. The solder bump 40 can be made of any solderable metal known in the art and process of forming the solder bumps 40 can be carried out as known in the art.

Figure 2A:
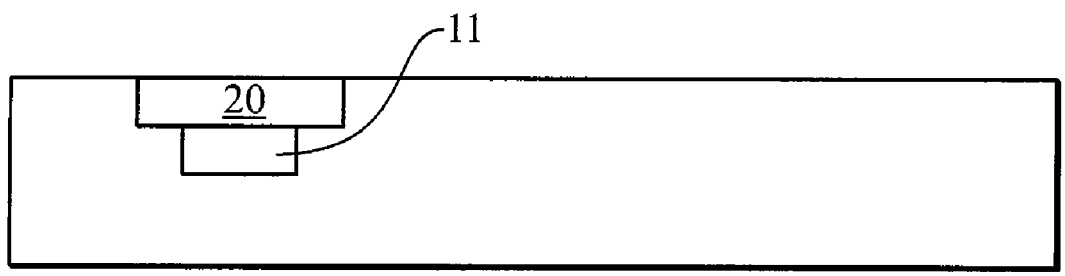
FIGS. 2A, B, & C illustrate a partial method of packaging an IC chip in one aspect of the invention.
Figure 2B:
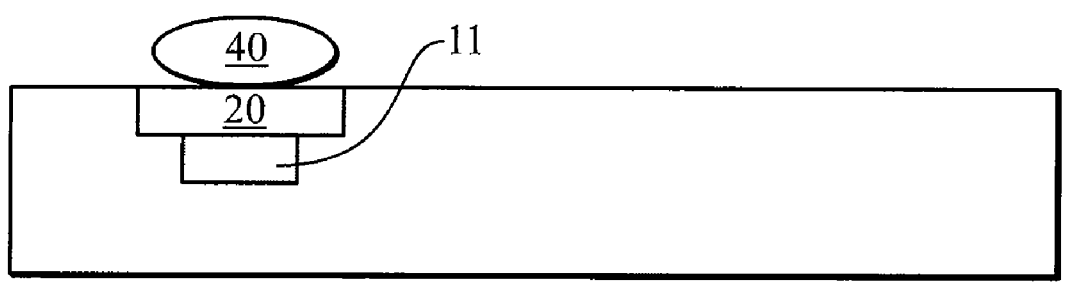

The resulting bumping structure is formed over the semiconductor die 10 as shown in FIG. 2B. Then, this bumping structure is used to bond the semiconductor die 10 to a substrate, which is in one aspect of the invention a lead frame 30. The lead frame supports the die, serves as a fundamental part of the I/O interconnection system, and also provides a thermally conductive path for dissipating the majority of the heat generated by the die. This bonding process is carried out by aligning the die 10 with bumps 40 over the desired location of the lead frame 30 and then pressing the die 10 and lead frame 30 together under heat so that the bump 40 (which is already attached to die 10) becomes attached to lead frame 30.

Before the bonding process, the lead frame 30 is manufactured either by stamping or by masked etching. The lead frame features an interconnected metallized pattern that is made up of the following: a centrally located support to which the die containing chip 10 is attached and a network of leads 35 (containing a gate lead 55 and source leads 60) extending therefrom. Metal strips (not shown) that act as dam bars are located between the leads at points that will eventually be just outside the edge of the completed package assembly. During the encapsulation process, these dam bars help prevent encapsulant from seeping out of the mold and flowing onto the leads where it could later adversely affect lead trim and form operations. Additional bars (not shown) can be located between the lead tips to provide protection of the leads from mechanical damage during processing and handling. The lead frame is manufactured with a gull wing configuration as known in the art.

Figure 2C:
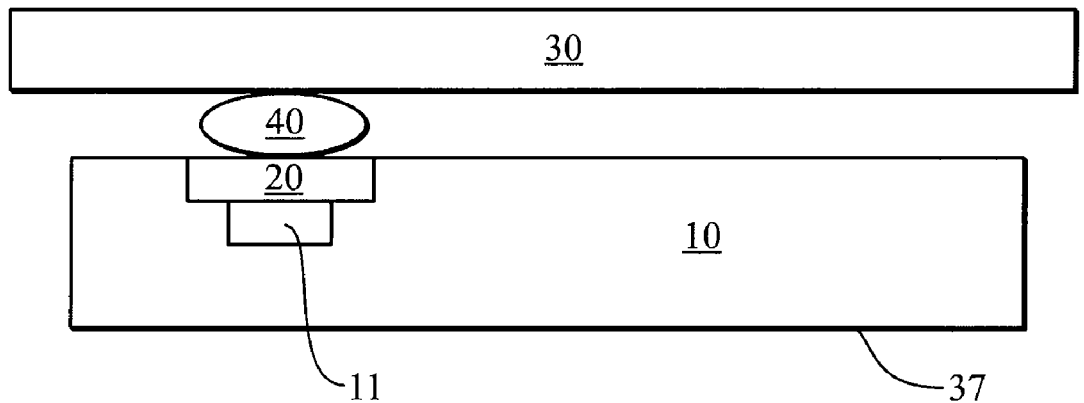

After performing the "flip-chip" technique, the resulting structure is illustrated in FIG. 2C. Next, this structure is then encapsulated. This encapsulation can be carried out by any known encapsulation process that obtains the structure depicted in FIGS. 3A and 3B. Examples of such encapsulation processes include premolding, postmolding, or boschman molding processes. In premolding, a plastic base is first molded; the die is then placed on it and is connected to the desired I/O configuration. Finally, a separate plastic lid (or top) is joined to the base. In postmolding, the leadframe with an attached die is loaded into a multicavity molding fixture and is encapsulated in molding compound using a single molding process.

In one aspect of the invention, a boschman molding technique is used during the encapsulation process. In this technique, a film is attached on the "reverse" face (or side 37) of the die 10 before the encapsulation procedure. This reverse face is that side of the die 10 containing the drain and the corresponding side of the leads of the lead frame. The film is attached to the dies by lining the bottom of the mold with a sheet of the film. The structure is then place in a mold and the encapsulant material is transferred into the mold. A laminating tool is placed over the dambar or leadframe surface to laminate the leadframe onto the film. The mold is closed and encapsulant material cured to create the encapsulant 45. The molded structure is removed and the film then peeled off after the encapsulation to obtain the structure depicted in FIGS. 3A and 3B. Using this process, the resulting structure can be manufactured without any remaining adhesive residue.

In manufacturing similar devices by molding operations, it is well recognized that certain disadvantages occurred. During the encapsulation and subsequent removal of excess material, the encapsulant enclosed both the die and die bonds, as well as extended along the surface of the die-mounting substrate. The excess encapsulant, sometimes called mold bleed (i.e., encapsulant other than that necessary to enclose the die and die bonds), must then be removed by a subsequent process.

One method for removing this mold bleed was the simple mechanical act of peeling. When the excess encapsulant was peeled away from the substrate surface, however, some of the mold bleed adhered to the substrate surface, twisting the substrate and tearing/rupturing the substrate surface. This damage to the packaged chip can be cosmetic (i.e. marring of the substrate surface) and/or functional (e.g. fracturing of the substrate; destruction of the electrically conductive traces on the substrate surface; tearing away of the solder mask on the substrate surface to undesirably expose, for instance, copper; and/or weakening or breaking of the seal between the encapsulant and the substrate surface). By using the molding technique described above, however, this molding bleed—and the damage from its removal—can be avoided.

Figure 3A:
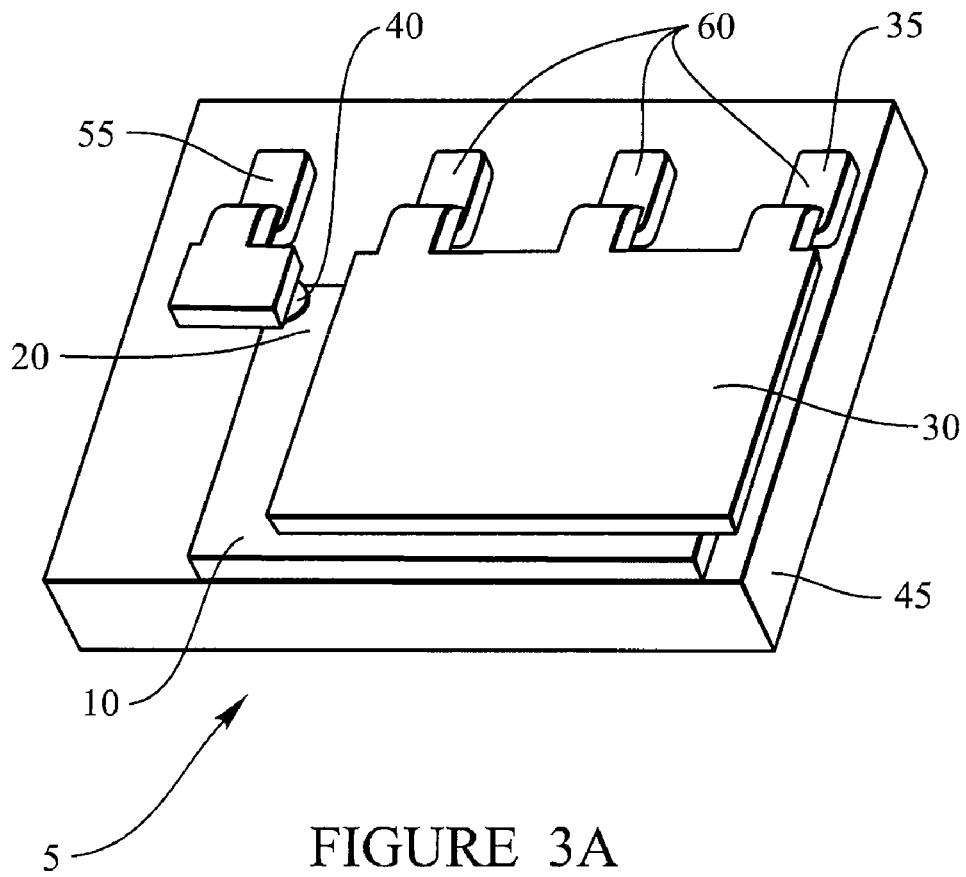
FIGS. 3A and B illustrate a packaged IC chip in one aspect of the invention.
Figure 3B:
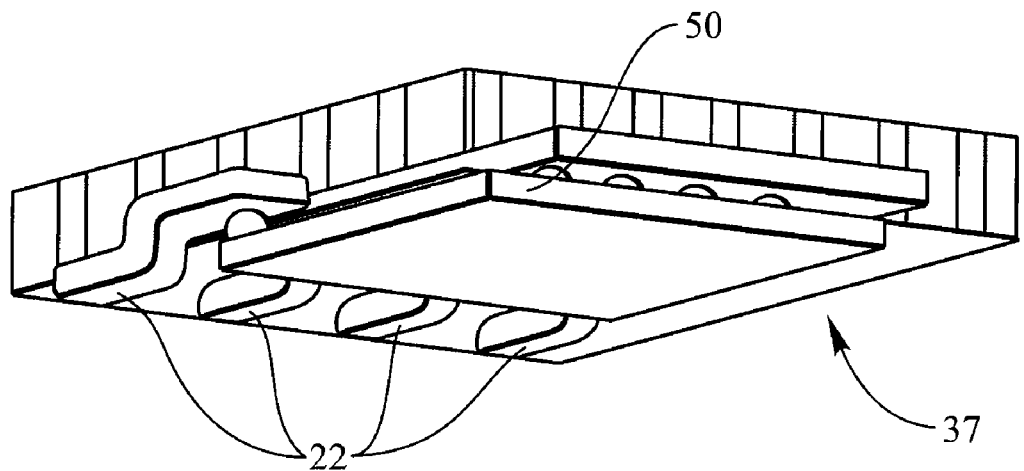
Figure 4:
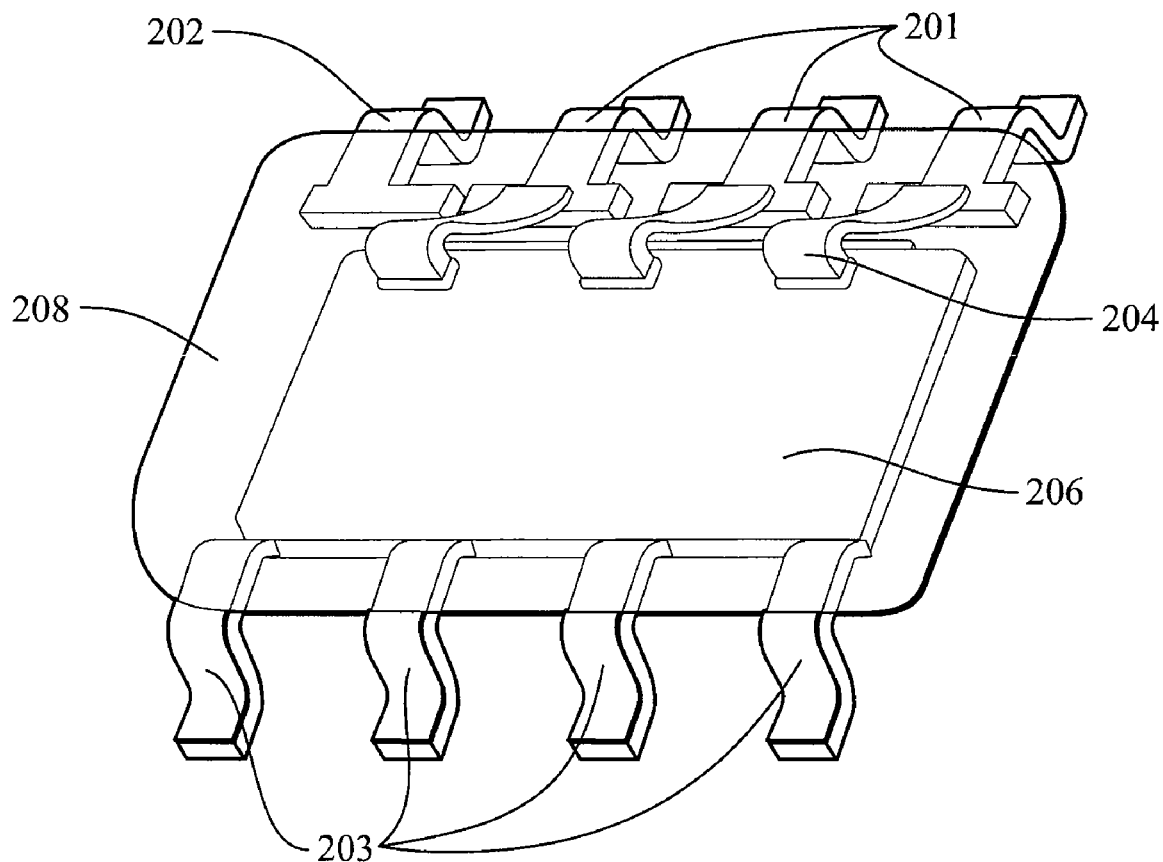
FIGS. 4 and 5 illustrate conventional packaged IC chips.
Figure 5:
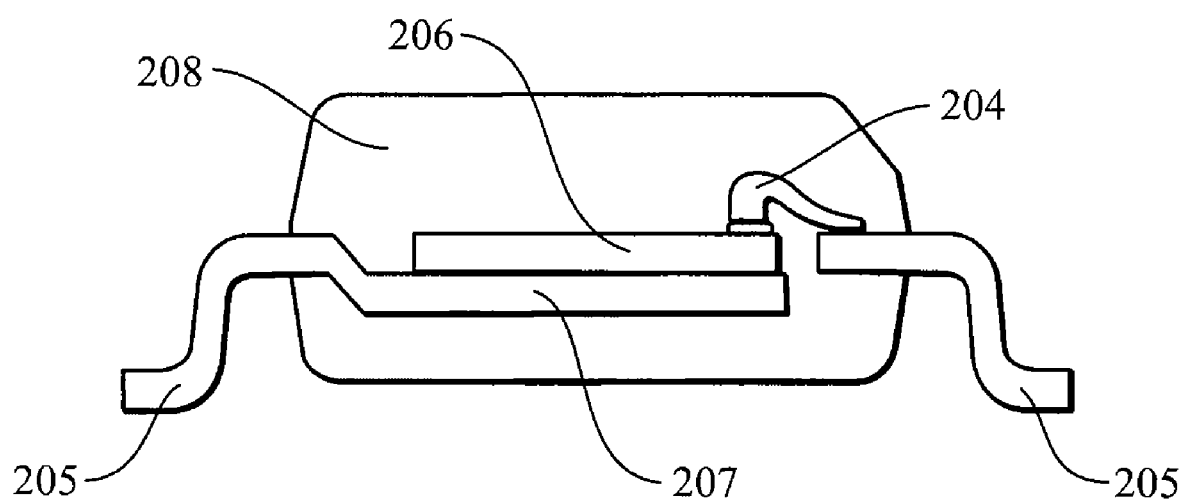

After being encapsulated, the packaged chip of the invention obtained is depicted in FIGS. 3A and 3B. As illustrated, the packaged IC chip 5 contains exposed land and die bottom surfaces 22 as well as an exposed drain 50. These surfaces are used for connecting (or mounting) the packaged IC chip directly to the circuit board of an electronic device or system in which the packaged IC chip 5 is used.

Any method of mounting the packaged IC chip to a circuit board of an electronic apparatus that provides a direct connection between the exposed portions of packaged chip and the circuit board can be used in the invention.

The packaged chip of the invention provides several advantages over other known packaged chips in the art. First, the packaged chips of the invention have a relatively low drain/source resistance. In the packaged chips, the source and gate are connected directly to the leadframe by solder balls. And since the drain and the leads of the leadframe are mounted directly onto the circuit board without an intervening encapsulant, a short electrical resistive path is created.

The second advantage is that the packaged chips of the invention have a smaller footprint and lower profile. In the packaged chips, the leads are eliminated on the drain side of the package. As well, the gate and source are directly connected to the frame, thereby allowing the leads to be located closer to the edge of die. Further, the packaged chips have no encapsulation on the bottom of the molded package (i.e., exposing the die).

The third advantage is that the packaged chips of the invention have an improved package inductance. This advantage exists because of two features of the packaged chips. First, the use of gold wire has been eliminated. Second, the gate and source pins are directly connected to the leadframe.

The fourth advantage is that the packaged chips of the invention have a more efficient thermal performance. The drain of the packaged chip is mounted directly from the die back to the circuit board without any encapsulation. Thus, heat generated by the chip during its operation is quickly dissipated into the circuit board.

The final advantage is that the packaged chips of the invention have a simpler manufacturing process for the following reasons. First, a flip chip technique is used in place of the tedious and time consuming wire bonding. Second, it is map molded with a sheet lining on the bottom mold that is laminated to the bottom side of the package with exposed die back, resulting in little to no mold bleed. Finally, the IC chip can be sawn and/or diced to the desired package size because of the subsequent processing used.

Having described the preferred embodiments of the invention, it is understood that the invention defined by the appended claims is not to be limited by particular details set forth in the above description, as many apparent variations thereof are possible without departing from the spirit or scope thereof.

We claim:

1. A semiconductor device, comprising:
   a semiconductor die; and
   a lead frame attached to the semiconductor die without using a bond wire;
   wherein the die and the lead frame are substantially encapsulated except for a part of the bottoms of the die and the lead frame so that any exposed lead frame surface is substantially coplanar with the encapsulation and wherein the device contains no leads connected to a drain of the die on the drain side of the die.

2. The device of claim 1, wherein the leads on the source side of the device are gull-wing leads.

3. An electronic apparatus containing a semiconductor device, the device comprising:
   a semiconductor die; and
   a lead frame attached to the semiconductor die without using a bond wire;
   wherein the die and the lead frame are substantially encapsulated except for a part of the bottoms of the die and the lead frame so that any exposed lead frame surface is substantially coplanar with the encapsulation and wherein the device contains no leads connected to a drain of the die on the drain side of the die.

4. The apparatus of claim 3, wherein the leads on the source side of the device are gull-wing leads.

5. A semiconductor device, comprising:
   a semiconductor die having a source and a drain; and
   a lead frame attached to the semiconductor die without using a bond wire and containing no leads connected to the drain of the die on the drain side of the die;
   wherein the die and the lead frame are substantially encapsulated except for a part of the bottoms of the die and the lead frame so that any exposed lead frame surface is substantially coplanar with the encapsulation.

6. The device of claim 5, wherein the die is attached to the lead frame via solder balls.

7. The device of claim 5, wherein the encapsulation is performed by a boschman molding technique.

8. The device of claim 5, wherein the part of the die that is attached to the lead frame comprises a source and a gate for the semiconductor device.

9. The device of claim 5, wherein the leads on the source side of the device are gull-wing leads.

10. An electronic apparatus containing a semiconductor device, the device comprising:
    a semiconductor die having a source and a drain; and
    a lead frame attached to the semiconductor die without using a bond wire and containing no leads connected to the drain of the die on the drain side of the die;
    wherein the die and the lead frame are substantially encapsulated except for a part of the bottoms of the die and the lead frame so that any exposed lead frame surface is substantially coplanar with the encapsulation.

11. The apparatus of claim 10, wherein the die is attached to the lead frame via solder balls.

12. The apparatus of claim 10, wherein the encapsulation is performed by a boschman molding technique.

13. The apparatus of claim 10, wherein the part of the die that is attached to the lead frame comprises a source and a gate for the semiconductor device.

14. The apparatus of claim 10, wherein the leads on the source side of the device are gull-wing leads.

* * * * *